US008502556B2

(12) United States Patent
Desprez-Le-Goarant et al.

(10) Patent No.: US 8,502,556 B2
(45) Date of Patent: Aug. 6, 2013

(54) SYSTEM AND METHOD FOR REDUCING INPUT CURRENT SPIKE FOR DRIVE CIRCUITRY

(75) Inventors: Yann Desprez-Le-Goarant, Singapore (SG); Jingfeng Gong, Singapore (SG)

(73) Assignees: STMicroelectronics Asia Pacific Pte Ltd, Singapore (SG); STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 13/341,317

(22) Filed: Dec. 30, 2011

(65) Prior Publication Data
US 2013/0169312 A1 Jul. 4, 2013

(51) Int. Cl.
*H03K 17/16* (2006.01)
*H03K 19/003* (2006.01)

(52) U.S. Cl.
USPC .................................. 326/27; 326/83; 326/87

(58) Field of Classification Search
USPC .................. 326/31–34, 62, 82–87, 93, 95, 98, 326/104, 112, 119, 121, 122
See application file for complete search history.

(56) References Cited

U.S. PATENT DOCUMENTS 5,550,490 A * 8/1996 Durham et al. ................. 326/98
5,739,707 A * 4/1998 Barraclough ................. 327/112

\* cited by examiner

*Primary Examiner* — Jany Richardson
(74) *Attorney, Agent, or Firm* — Gardere Wynne Sewell LLP

(57) ABSTRACT

A circuit includes a plurality of logic gates and a drive circuit. The plurality of logic gates are coupled between a first supply node and a second supply node. Each logic gate has at least one input and consumes a short circuit current during a logic state transition. The drive circuit is coupled to the inputs of the plurality of logic gates to deliver a copy of an input signal to each logic gate, wherein the input signal copies arrive at the inputs of the logic gates at substantially different times. The circuit may be incorporated in a touch screen panel and a display.

22 Claims, 3 Drawing Sheets

SYSTEM AND METHOD FOR REDUCING INPUT CURRENT SPIKE FOR DRIVE CIRCUITRY

BACKGROUND

This invention relates to a drive circuit incorporated in a touch screen and a display circuit. More particularly, the drive circuit includes circuitry for driving a plurality of logic gates that are connected in parallel, wherein each of which consume a short circuit current during a logic state transition.

Complementary metal-oxide semiconductor (CMOS) is a technology for constructing digital logic circuits and for several analog circuits such as image sensors, data converters and transceivers used in many types of communication. CMOS uses complementary and symmetrical pairs of p-type and n-type metal oxide semiconductor field effect transistors (MOSFETs) for implementing logic functions. An example of a circuit 2 that performs an inverting or NOT function is shown in FIG. 1A. In the inverting circuit 2, an input 4 is connected to both a PMOS transistor 6 and an NMOS transistor 8. When the voltage at the input 4 is low, the channel of the NMOS transistor 8 is in a high resistance state. This limits the current that can flow from an output 10 to ground. The channel of the PMOS transistor 6 is, however, in a low resistance state and much more current can flow from a supply 12 to the output 10. Because the resistance between the supply 12 and the output 10 is low, the voltage drop between the supply 12 and the output 10 due to a current drawn from the output 10 is small. The output 10 therefore registers a high voltage.

Conversely, when the voltage of the input 4 is high, the PMOS transistor 6 is in an OFF (high resistance) state, thereby limiting the current flowing from the supply 12 to the output 10, whereas the NMOS transistor 8 is in an ON (low resistance) state, thereby allowing the output 10 to drain to ground. Because the resistance between the output 10 and ground is low, the voltage drop due to a current drawn into the output placing the output above ground is small. This low drop results in the output 10 registering a low voltage. In summary, the output of the PMOS and NMOS transistors 6 and 8 are complementary such that when the input 4 is low, the output 10 is high, and when the input 4 is high, the output 10 is low. Because of this behavior of the input 4 and output 10, the CMOS circuit's output 10 is the inversion of the input 4.

As illustrated in FIG. 1B, there is a finite rise/fall time in the input signal 14 when it transitions between off and on because of the capacitance of the PMOS and the NMOS transistors 6 and 8. During this transition, both the transistors 6 and 8 will be on for a small period of time, and the current will flow directly from the supply 12 to ground, resulting in a short circuit current 16 as shown in FIG. 1B. This is typically the case in the digital domain where the supply voltage Vdd is higher than the combination of the threshold voltages of the PMOS and NMOS transistors, Vth(P) and Vth(N) respectively. It is also the case for logic functions created in the analog domain when the analog supply voltage Vdd is higher than the combination of the threshold voltages of the PMOS and NMOS transistors, Vth(P) and Vth(N) respectively. It should be understood that the threshold voltage of a transistor is the gate-source voltage at which the drain current reaches some defined small value. As shown in FIG. 1B, the short circuit current 16 through a single pair of PMOS and NMOS transistors may not be significant. However, as shown in FIGS. 2A and 2B, when there are many such transistor pairs 6A, 6B, 6C connected in parallel, there is an increase in capacitance of the transistors that will result in an even slower rise/fall time of a signal 18 at an input 4A. Consequently, the short circuit current 20 flowing through the transistor pairs 6A, 6B, 6C is increased both in magnitude and duration as shown in FIG. 2B.

Typically, a regulator circuit is connected to the transistor pairs to supply voltage and current to the transistor pairs. The short circuit current results in a large spike in the supply current. This may result in a drop in the supply voltage. In some embodiments, to avoid such a condition, a decoupling capacitor may be connected across the output of the regulator. Additionally or alternatively, a larger and more powerful regulator may be used in other embodiments. However, since space is limited on some circuit boards, the addition of a decoupling capacitor or the use of a larger regulator may not be possible. Therefore, there exists a need to provide drive circuitry that does not require the use of a decoupling capacitor or large regulator to reduce the current spike.

SUMMARY

The present disclosure provides a circuit comprising: a plurality of logic gates coupled between a first supply node and a second supply node, wherein each logic gate has at least one input and is operable to consume a short circuit current during a logic state transition; and a plurality of drive circuits, each drive circuit coupled to the input of one of the plurality of logic gates, wherein each drive circuit is operable to deliver a copy of an input signal to each respective logic gate, wherein each copy of the input signal arrives at the inputs of the respective logic gates at substantially different times.

Another embodiment provides a device comprising: inverter circuitry coupled between a first supply node and a second supply node, wherein the inverter circuitry has at least one input and is operable to consume a short circuit current during a logic state transition; and drive circuitry coupled to the inputs of the inverter circuitry, the drive circuitry operable to provide at least one copy of an input signal to the inverter circuitry, wherein each copy of the input signal arrives at the inverter circuitry at substantially different times.

Yet another embodiment of the present disclosure provides a method for reducing input current spike in a drive circuit having a plurality of logic gates coupled between a first supply node and a second supply node, wherein each logic gate has at least one input and consumes a short circuit current during a logic state transition, the method comprising: delivering a copy of an input signal to each logic gate, wherein each copy of the input signal arrives at the respective inputs of the logic gates at substantially different times.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE EMBODIMENTS

Figure 3A:
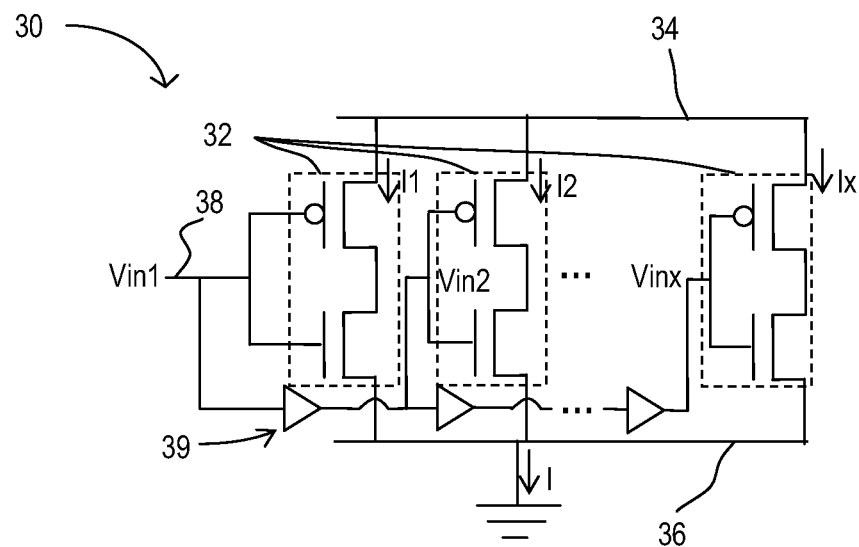
FIG. 3A illustrates an example embodiment of a drive circuit according to an embodiment of the present disclosure for providing input signals to multiple CMOS inverters.
Figure 3B:
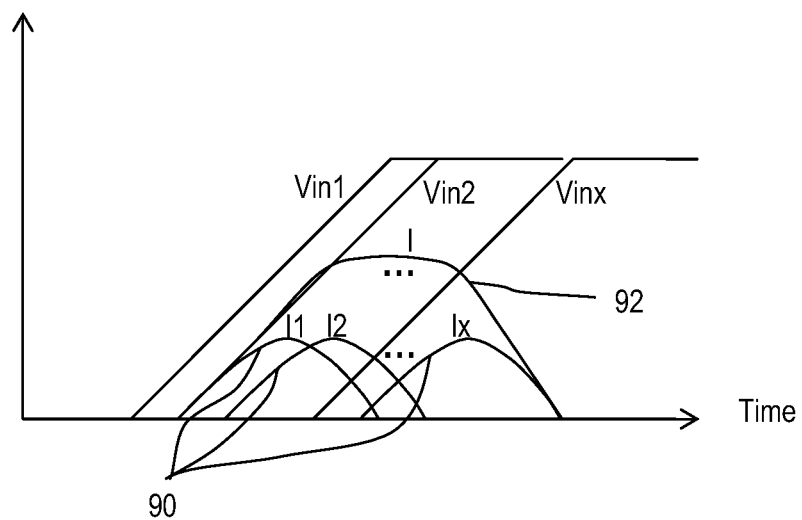
FIG. 3B illustrates a graph showing input signals and currents drawn by the CMOS inverters in FIG. 3A.

FIG. 3A illustrates an example embodiment of the disclosed circuit 30 comprising multiple logic gates 32 (CMOS inverter circuitry) connected between a first supply node 34 and a second supply node 36, wherein each logic gate 32 has at least one input 38 and consumes a short circuit current during a logic state transition. The circuit 30 also includes a drive circuit 39 that is coupled to the respective inputs 38 of each of the logic gates 32 to deliver a copy of an input signal Vin1 to each of the logic gates 32. Due to propagation of the input signal Vin1, each of the input signal copies arrives at the inputs 38 of the logic gates 32 at substantially different times. The corresponding input signals and currents drawn from the CMOS inverter circuitry 32 are illustrated in FIG. 3B, and are further described below.

Figure 4:
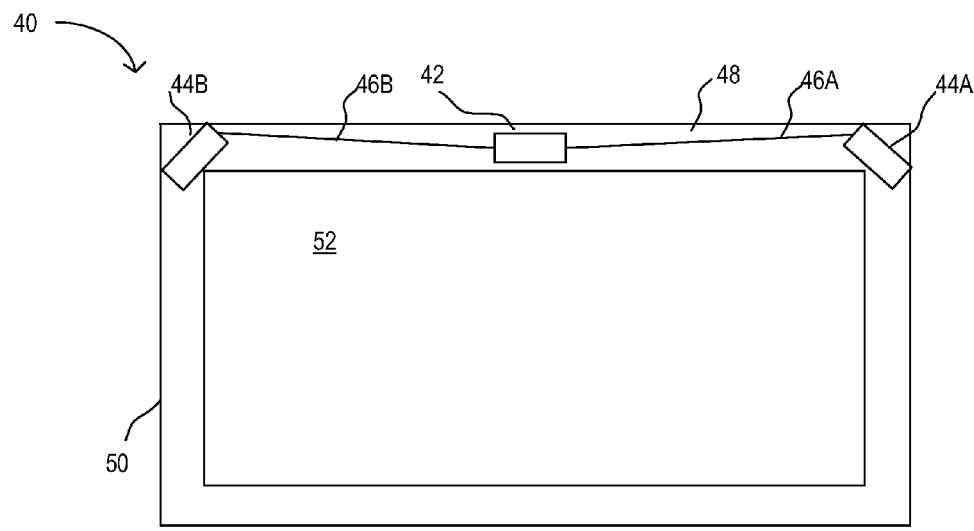
FIG. 4 illustrates a touch screen panel according to another embodiment of the present disclosure, wherein the touch screen panel includes an optical module incorporating the drive circuit in FIG. 3.

FIG. 4 shows an embodiment of a device 40 incorporating the circuit 30 described above. In one embodiment, the device 40 may be a touch screen panel 40 having a microcontroller unit 42 connected to two optical modules 44A and 44B via respective flexible cables 46A and 46B. The microcontroller unit 42 is typically mounted at a medial portion of a top border 48 of a frame 50 of the touch screen panel 40 and the two optical modules 44A and 44B are mounted at the two top corners of the frame 50. The area enclosed by the frame 50 comprises the touch area 52.

Figure 5:
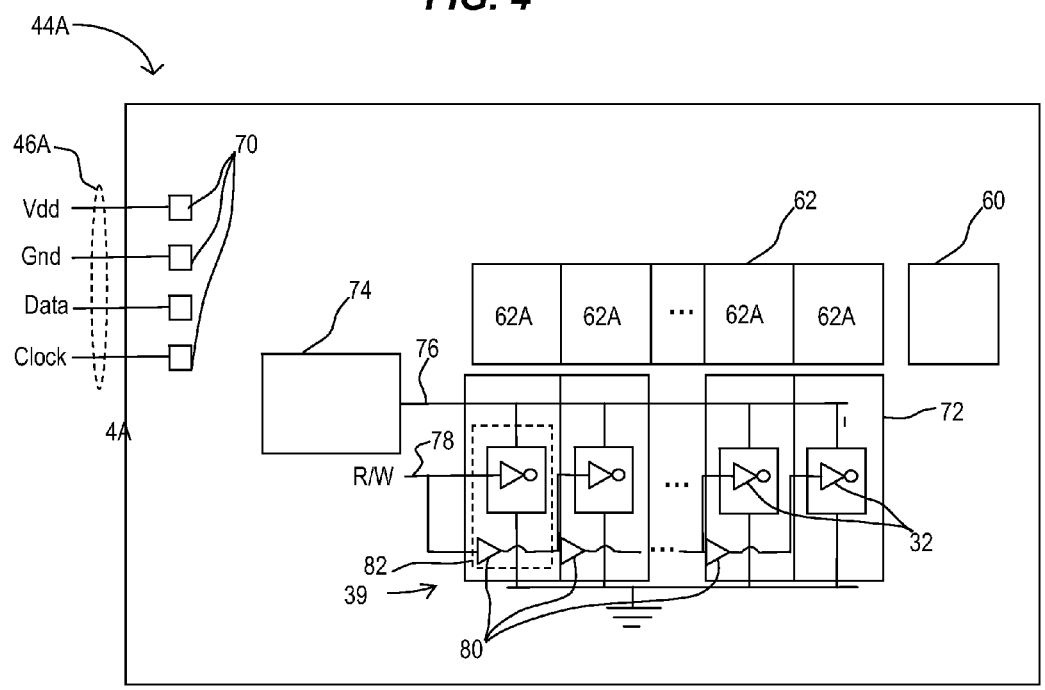
FIG. 5 illustrates a detailed view of the optical module in FIG. 4.

Reference is now made to FIG. 5, which illustrates an example embodiment of the optical module 44A illustrated in FIG. 4. Each optical module 44A and 44B includes a light source 60 such as, for example, a light emitting diode (LED), and a pixel sensor array 62. The light emitted by the light source 60 may be infrared (IR) light or near IR light. Alternatively, the light source 60 may emit ultra violet or visible light energy (e.g., at one or more frequencies, wavelengths, or spectrums). The pixel sensor array 62 can be based on CMOS, charge coupled device (CCD), or charge injection device (CID) technologies, or any other sensors capable of detecting changes in electromagnetic radiation.

During use under the control of the microcontroller unit 42, the light source 60 is driven to emit light across a surface of the touch area 52 to thereby "illuminate" it. A pointer or other object placed within the touch area 52 disturbs the illumination and creates a shadow effect that can be detected by the pixel sensor array 62. When nothing is placed on the surface of the touch area 52, the emitted light is not obstructed and is able to travel towards side borders and the bottom border of the frame 50 to be reflected by reflective elements (not shown) mounted on these side borders and bottom border of the frame 50. The light beams are reflected back toward the light source 60 generally along a line that is parallel to the incident wave or beam. The pixel sensor array 62 is therefore able to receive substantially all the light that is emitted by the light source 60. If however an object, such as a human finger, is placed at a location on the surface of the touch area 52 to block the propagation of some of the light emitted by the light source 60 across the surface of the touch area 52, the obstructed portion of the emitted light would therefore not be reflected back to the pixel sensor array 62. The pixel sensor array therefore receives less light than before. The optical module 44A is thus able to capture data regarding variations in the electromagnetic radiation and transmit the captured data to the microcontroller unit 42. The other optical module 44B is controlled by the microcontroller unit 42 to operate in a similar manner A measure of the change in the amount of light received by particular pixels 62A of the two pixel sensor arrays 62 allows the microcontroller unit 42 to determine, using known triangulation techniques, the touch location (co-ordinates) of the object on the touch area 52, as further explained below. The microcontroller unit 42 is also able to identify one or more gestures based on a series of captured touch locations. When mounted to a display (not shown) to define a touch screen system, the touch screen panel 40 enables a user to view and interact with visual output presented on the display. It should be understood that the term "touch" as used herein is intended to refer generally to an interaction between a pointer and a display screen and not specifically to contact between the pointer and the display screen.

In addition to the light source 60 and the pixel sensor array 62, each optical module 44A and 44B includes four connection pads 70 to which the flexible cable 46A or 46B is connected. The four pads 70 are connected to respective Vdd, Ground, Clock and Data signal lines. The microcontroller unit 42 controls the optical module 44A via the Clock and Data signal lines. The optical module 44A further includes SRAM cells 72 each of which is coupled to a corresponding pixel 62A of the pixel sensor array 62. The output of each pixel 62A is compared to a ramp reference signal using a comparator (ramp reference signal and comparator not shown). An analog-to-digital convertor (ADC) (not shown) is used to convert the ramp reference signal to a digital value. The output of the comparator is used as a latching signal to latch the output of the ADC into the SRAM cell 72 during a write cycle of the SRAM cell 72. The microcontroller unit 42 reads the contents of the SRAM cells 72 to determine which of the pixels 62A have received less light. With proper calibration of the angle and position of the pixel sensor array 62, as is known to those skilled in the art, it is possible to determine the touch location in the touch area 52. The optical module 44A further includes a regulator 74 having a first supply output 76, typically of 1.8V, for powering the SRAM cells 72. The first supply output 76 may or may not be connected to a decoupling capacitor.

The writing and reading of the SRAM cells 72 are controlled via a single read/write (R/W) control line/input 78 which is generated by the optical module 44A based on data from the microcontroller unit 42. More specifically, the SRAM cells 72 are controlled by a digital R/W signal on the R/W control line 78. In this embodiment, the R/W control line 78 is connected to a series (or chain) of buffers 80. Each buffer 80 may be two inverters (not shown) connected in series. The output of each buffer 80 is connected to an input of a CMOS inverter 32 associated with each SRAM cell 72. Those skilled in the art should recognize that the R/W control signal 62 and an inverted signal produced by the CMOS inverter 66 are used to operate the SRAM cell 60 during respective read/write cycles. In this manner, the input signal applied to the R/W control line 78 is increasingly delayed as the input signal propagates through the series of buffers 80. The output of each buffer 80 is therefore a copy of the input signal delayed by a different length of time proportional to the position of the buffer 80 in the series. Thus, the buffer 80 acts as a signal delay element. Other types of signal delay elements may also be used in place of, or in combination with, the buffers 80.

Figure 1A:
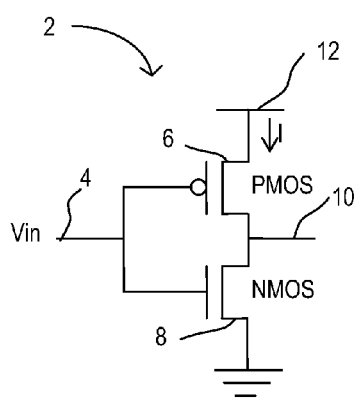
FIG. 1A illustrates an example embodiment of a CMOS inverter circuit.
Figure 1B:
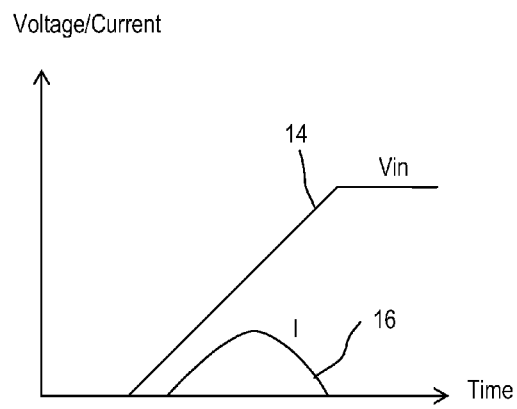
FIG. 1B illustrates a graph showing the rise in the input signal and the corresponding change in the current drawn by the CMOS inverter circuit in FIG. 1A.
Figure 2A:
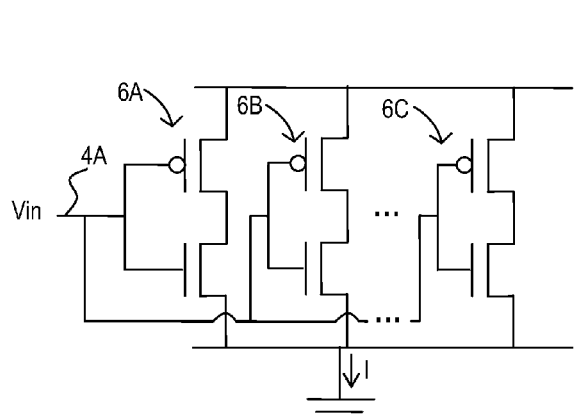
FIG. 2A illustrates an example embodiment of a circuit having multiple CMOS inverters connected in parallel and having a common input.
Figure 2B:
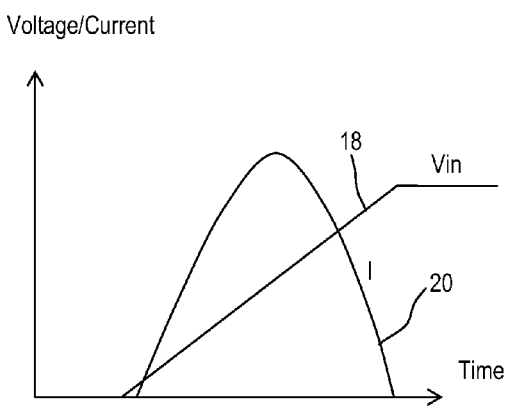
FIG. 2B illustrates a graph showing the rise in the input signal at the common input and the corresponding change in the total current drawn by the CMOS inverters in FIG. 2A.

Each buffer 80 may introduce a delay period ranging, for example, from a fraction of a nanosecond to a few nanoseconds. The delay period may be determined based on one or more factors, including but not limited to, a gate capacitance and a driving current of the logic gate 32 and the size of the buffer 80. In this embodiment, each buffer 80 is associated with a SRAM cell 72 to thereby define a repeating unit 82. Also, in this embodiment, the CMOS inverter 32 includes a PMOS transistor and a NMOS transistor connected in series with the PMOS transistor as shown in FIG. 1A. The gates of the PMOS and NMOS transistors are connected for receiving a copy of the input signal.

Advantageously, the staggered arrival of the copies of the input signal at the respective inputs of the CMOS inverters 32 ensures that the CMOS inverters 32 are not simultaneously switched. As shown in FIG. 3B, the short circuit currents 90 of the CMOS inverters 32 are thus spaced apart in time to result in a reduced overall current spike 92 in the supply current that is spread over time and smaller in amplitude. With such a current profile, a regulator 74 with a correspondingly lower rating may be used in the optical module 44A with or without a decoupling capacitor connected across its output. Had the logic state transitions of the CMOS inverters 32 been made concurrently, a regulator of a higher rating and/or a decoupling capacitor connected across its output would have been required.

According to another aspect of the invention, there is provided a method that includes connecting multiple logic gates between a first supply and a second supply, wherein each logic gate has at least one input and consumes a short circuit current during a logic state transition, and delivering a copy of an input signal to each logic gate, wherein the input signal copies arrive at the inputs of the logic gates at substantially different times. The method may further include providing the first supply without a decoupling capacitor. The first supply may be provided by a regulator whose output current rating is insufficient to meet the combined short circuit currents of the logic gates when logic state transitions are made concurrently.

Although the present invention is described as implemented in the above described embodiment wherein delayed copies of the input signal is used to drive the logic gates, it is not to be construed to be limited as such. For example, the invention may be implemented in an embodiment with the drive circuit receiving the input signal and deriving new signals therefrom that are copies of the input signals.

As another example, the logic gate may be any type of logic gate, including a NOT, NAND and NOR gate. As yet another example, the data captured by the optical module is described to be received and processed by a microcontroller unit of the touch screen panel. However, this should not be construed to be limited as such. The data may instead be provided to a central processing unit of the device to which the touch screen panel is mounted.

As yet a further example, the circuit can also be implemented in a display having an integrated touch screen. That is, the touch screen panel may be built into the display itself. In fact, the drive circuit described above may be used in any electronic device having components that are connected in parallel and wherein there is limited space for a larger regulator or decoupling capacitor.

What is claimed is:

1. A circuit comprising:
    a plurality of logic gates coupled between a first supply node and a second supply node, wherein each logic gate has at least one input and at least one output, wherein the outputs of the plurality of logic gates are not connected to each other, and wherein each logic gate is operable to consume a short circuit current during a logic state transition; and
    a plurality of drive circuits, each drive circuit coupled to the input of one of the plurality of logic gates, wherein each drive circuit is operable to deliver a copy of an input signal to the input of each respective logic gate, wherein each copy of the input signal arrives at the inputs of the respective logic gates at substantially different times.

2. A circuit according to claim 1, wherein the drive circuit receives the input signal and derives new signals that are copies of the input signal.

3. A circuit according to claim 1, wherein each copy of the input signal comprises a copy of the input signal delayed by a different length of time.

4. A circuit according to claim 3, wherein the input signal is fed to a plurality of delay elements connected in series and wherein each copy of the input signal comprises a signal tapped from a respective output of the delay elements.

5. A circuit according to claim 4, wherein the plurality of delay elements comprise a plurality of buffers.

6. A circuit according to claim 5, wherein each buffer is associated with each logic gate to define a repeating unit.

7. A circuit according to claim 1, wherein each logic gate comprises one of a NOT, NAND and NOR gate.

8. A circuit according to claim 1, wherein each logic gate includes:
    at least one PMOS transistor; and
    at least one NMOS transistor directly connected in series with the PMOS transistor; wherein the gates of the respective PMOS and NMOS transistors are operable to receive a copy of the input signal.

9. A circuit according to claim 1, further comprising a regulator having a first supply output.

10. A circuit according to claim 9, wherein the first supply output of the regulator is not coupled to a decoupling capacitor.

11. A circuit according to claim 9, wherein the first supply output of the regulator is directly coupled to a plurality of SRAM cells.

12. A device comprising:
    inverter circuitry coupled between a first supply node and a second supply node, wherein the inverter circuitry comprises a plurality of inverter circuits each having at least one input and at least one output, wherein the outputs of the plurality of inverter circuits are not connected to each other, and wherein each inverter circuit is operable to consume a short circuit current during a logic state transition; and
    drive circuitry coupled to the inputs of the inverter circuitry, the drive circuitry operable to provide at least one copy of an input signal to each inverter circuit, wherein each copy of the input signal arrives at each one of the inverter circuits of the inverter circuitry at a different time.

13. A device according to claim 12, wherein each copy of the input signal comprises a copy of the input signal delayed by a different length of time.

14. A device according to claim 13, wherein the input signal is fed to a plurality of buffers connected in series and wherein each copy of the input signal comprises a signal tapped from a respective output of the buffers.

15. A device according to claim 12, wherein each inverter circuit includes:
    at least one PMOS transistor; and
    at least one NMOS transistor directly connected in series with the PMOS transistor; wherein the gates of the respective PMOS and NMOS transistors are operable to receive a copy of the input signal.

16. A device according to claim 12, further comprising a regulator having a first supply output having no decoupling capacitor connected thereto.

17. A device according to claim 12, wherein the device comprises one of a touch screen panel and a display.

18. A device according to claim 17, wherein the device includes a plurality of SRAM cells, a light source, a pixel sensor array, an optical module, and a microcontroller.

19. An apparatus, comprising:
    a plurality of sensor pixels;
    a plurality of data storage cells, each data storage cell coupled to a corresponding one of the plurality of sensor pixels, and each data storage cell configured to store a data value corresponding to sensor pixel output;
    a voltage regulator circuit configured to generate a supply voltage;
    each data storage cell comprising an inverter circuit coupled to receive said supply voltage;
    a read/write control line configured to receive a read/write signal; and
    a plurality of drive circuits coupled to the read/write control line, each drive circuit having an output coupled to an input of a corresponding one of the inverter circuits, wherein each drive circuit is operable to deliver a copy of the read/write signal to the input of each inverter circuit, wherein each copy of the read/write signal arrives at the inputs of the respective inverter circuits of the data storage cells at a different time.

20. The apparatus of claim 19, further comprising a light source configured to output light for detection by said plurality of sensor pixels.

21. The apparatus of claim 19, wherein the plurality of drive circuits comprise a plurality of delay elements connected in series, and wherein each copy of the read/write signal comprises a signal tapped from a respective output of the delay elements.

22. The apparatus of claim 19, wherein the data values corresponding to sensor pixel outputs are not simultaneously stored by the data storage cells due to the different read/write signal arrival times at the inverter circuits.

* * * * *